(12) United States Patent
Chandra et al.

(10) Patent No.: US 8,332,699 B2
(45) Date of Patent: Dec. 11, 2012

(54) SCAN INSERTION OPTIMIZATION USING PHYSICAL INFORMATION

(75) Inventors: Amit Chandra, Milpitas, CA (US); Muthukumaravelu Velayoudame, Fremont, CA (US); Mandeep Singh, San Jose, CA (US); Michael Mar, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 323 days.

(21) Appl. No.: 12/788,983

(22) Filed: May 27, 2010

(65) Prior Publication Data

US 2011/0296264 A1    Dec. 1, 2011

(51) Int. Cl.
*G01R 31/28* (2006.01)
(52) U.S. Cl. ........................ 714/729; 714/724
(58) Field of Classification Search .................. 714/724, 714/729
See application file for complete search history.

(56) References Cited

U.S. PATENT DOCUMENTS

| | | | |
|---|---|---|---|
| 5,983,376 A | 11/1999 | Narayanan et al. | |
| 6,191,603 B1 * | 2/2001 | Muradali et al. | 324/750.3 |
| 6,405,355 B1 | 6/2002 | Duggirala et al. | |
| 6,675,364 B1 | 1/2004 | Basto et al. | |
| 7,010,733 B2 | 3/2006 | Bassett et al. | |
| 7,127,695 B2 | 10/2006 | Huang et al. | |
| 2007/0283200 A1 * | 12/2007 | Casarsa | 714/724 |

* cited by examiner

*Primary Examiner* — Sam Rizk
(74) *Attorney, Agent, or Firm* — Lawrence J. Merkel; Meyertons, Hood, Kivlin, Kowert & Goetzel, P.C.

(57) ABSTRACT

In an embodiment, a design methodology and tools to implement the methodology are used to perform scan insertion in an integrated circuit design. The physical location of the scan chains within the boundaries of the integrated circuit may be determined, and the methodology may use the physical information to perform the scan insertion. For example, the physical information may include the location of the inputs and outputs of the scan chains, as well as routability data indicating the ability to insert interconnect in the integrated circuit to make the desired scan connections. The location and routability information may be used to group scan chain inputs and outputs for, e.g., compression/decompression logic. Using physical data to insert scan compression/decompression logic may reduce the amount of area occupied by the scan logic and connectivity, in some embodiments.

18 Claims, 7 Drawing Sheets

SCAN INSERTION OPTIMIZATION USING PHYSICAL INFORMATION

BACKGROUND

1. Field of the Invention

This invention is related to the field of scan functionality in integrated circuits, and specifically to inserting scan functionality during the design of an integrated circuit.

2. Description of the Related Art

As integrated circuit fabrication process technology has continued to shrink the size of transistors and other circuitry on an integrated circuit, the number of transistors and other circuitry has continued to increase. Additionally, the potential for manufacturing defects to occur that cause incorrect operation continues to increase. The importance of testability in the integrated circuit has therefore continued to increase.

An important part of design for test (DFT) methodologies is scan functionality. Generally, all of the clocked storage devices in the integrated circuits (e.g. flops, registers, latches, etc.) are designed with scan functionality so that the devices can be connected together in scan chains. During scan operation, known test data can be scanned into the devices. Once the test data is scanned in, at least one functional clock cycle can be performed. The circuitry that is connected to the devices evaluates in response to the test data, and the result is captured in the functional clock cycle(s). The result can then be scanned out and compared to expected data that should be generated if there are no manufacturing defects. With enough test data, most if not all of the integrated circuit can be tested to ensure high quality integrated circuits are delivered to customers.

The scan chains are created and connected to integrated circuit inputs and outputs via scan circuitry. In many cases, the scan logic and the connection of scan chains can be large, and impacts the ability to complete the integrated circuit design in a desired semiconductor substrate area. Additionally, at least some of the scan logic and connectivity is typically inserted late in the design process. Increasing the area between blocks of circuitry in the integrated circuit late in the process can create functional timing issues and other problems that slow design closure and completion. Typical scan insertion tools receive a list of scan chain inputs and outputs and generate register-transfer level (RTL) descriptions of the scan logic and interconnect based on the list.

SUMMARY

In an embodiment, a design methodology and tools to implement the methodology are used to perform scan insertion in an integrated circuit design. The physical location of the scan chains within the boundaries of the integrated circuit may be determined, e.g. as part of floor planning the design. The methodology may use the physical information as part of performing the scan insertion to link the scan chains to scan inputs and outputs. For example, the physical information may include the location of the inputs and outputs of the scan chains, as well as routability data indicating the ability to insert interconnect in the integrated circuit to make the desired scan connections. In some cases, the scan insertion may also insert scan compression/decompression logic. The location and routability information may be used to group scan chain inputs and outputs for the compression/decompression logic. Using physical data to insert scan compression and decompression logic may reduce the amount of area occupied by the scan logic and connectivity, in some embodiments.

BRIEF DESCRIPTION OF THE DRAWINGS

The following detailed description makes reference to the accompanying drawings, which are now briefly described.

Figure 1:
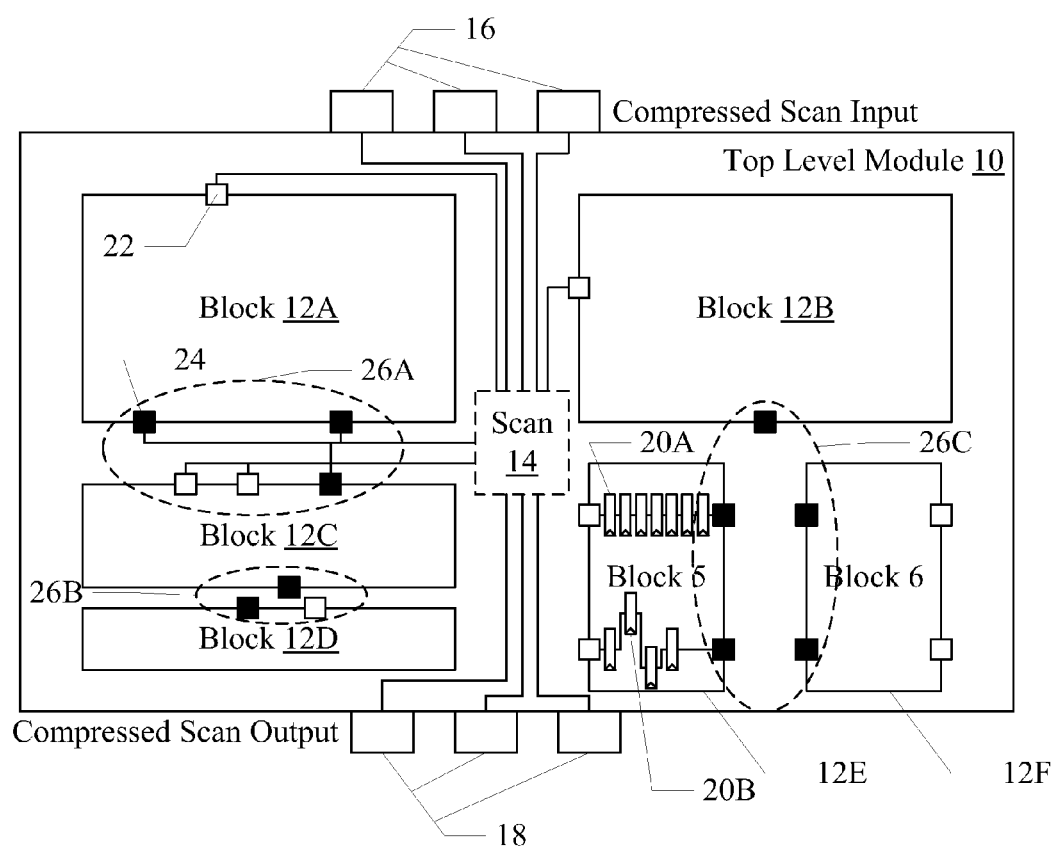
FIG. 1 is a block diagram of one embodiment of a top level module including multiple modules with scan inputs and outputs.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit design (or at least a portion thereof) is shown. In the illustrated embodiment, a top level module 10 is shown which includes blocks 12A-12F. A scan block 14 is shown as well, which may represent scan compression/decompression logic that is to be inserted using the scan insertion methodology described herein, in one embodiment. The top level module may include one or more scan input pins 16 and scan output pins 18. Each of the blocks 12A-12F may include one or more scan chains, such as the scan chains 20A-20B illustrated within the block 12E. Scan chain input pins are illustrated as white connection points on the blocks (e.g. reference numeral 22), and the scan chain output pins are illustrated as black connection points on the blocks (e.g. reference numeral 24).

At the point that scan insertion is performed according to the methodology described below, the blocks 12A-12F may have been synthesized and the scan chains in the blocks 12A-12F may be complete. The size and geometry of the blocks may also have been determined, as may the locations of the scan chain input pins and scan chain output pins within the determined geometry. The floor planning for the module 10 may have been performed, and thus the relative locations of the blocks within the module 10 and the spacing between the blocks may be known. The locations of the scan input pins 16 and scan output pins 18 on the module 10 may be known as well. Accordingly, the physical distances between the scan chain pins may be determined, even for pins that are on different blocks. Furthermore, the routability between the blocks may be known. Using the physical proximity information from the floor plan, the scan insertion may be performed more intelligently, selecting scan chain pins that are nearby for combination and/or linking with the scan input and output pins 16 and 18.

In various embodiments, scan pins and scan chain pins may be viewed as physically proximate based on the physical locations of the pins being near each other and/or based on the existence of routability between the pins. That is, if two pins are physically near but the interconnect congestion between the pins does not permit connection, the pins may not be considered physically proximate. Routability may refer to the ability to make connection between the pins, and/or between the pins and scan logic inserted via scan insertion. For example, in one embodiment, compressed scan functionality may be supported at the top module level 10. Logic may be inserted in the areas between the blocks as part of the compression/decompression. For example, logical exclusive OR or exclusive NOR gates may be used, or multiplexors may be used.

The methodology described below for scan insertion may include grouping scan chain pins that are determined to be physically proximate due to location and/or routability. Examples of scan chain pins that may be determined to be physically proximate are illustrated in FIG. 1 via dotted circles 26A-26C. The scan insertion methodology may include grouping the physically proximate scan pins, and combining the proximate pins in the scan insertion. The area occupied due to scan may be reduced, in an embodiment, as compared to scan insertion that is performed without any physical information.

As mentioned above, the scan insertion may include implementing scan compression. Specifically, the scan input pins 16 and scan output pins 18 may be compressed scan input and output pins. That is, the data input on the scan input pins 16 may be decompressed to produce scan data for the scan chains within the module 10. Data output from the scan output pins 18 may be compressed from the scan data in the scan chains within the module 10. The compression/decompression logic may be part of the scan block 14 and/or some of the logic may be located between the blocks in the module 10. Other embodiments may not implement scan compression, but may still perform scan insertion to provide connectivity among the scan chains, the scan input pins 16, and the scan output pins 18.

In an embodiment, the interconnect layers (also referred to as "metal layers") between the blocks 12A-12F may be used to connect between blocks, for scan connection, and for routing clock signals among the blocks. The clock routing may be implemented in the "upper" layers (those farther from the semiconductor surface of the integrated circuit) in one embodiment, and the routability for scan may be determined by examining the congestion at the "lower" layers (nearer the surface of the integrated circuit). In other embodiments, all layers may be considered to determine routability.

Generally, a block may be circuitry that implements any subfunction or subfunctions of the overall module 10. The block may be described in design files (e.g. register transfer level (RTL) descriptions and/or schematics) and may be synthesized as a unit and otherwise managed within the module 10 as a unit (e.g. for floor planning, place, and route). A module may be a collection of blocks and corresponding interconnect. A top level module may be a module that corresponds to an integrated circuit as a whole. Other modules may correspond to intermediate levels. For example, an integrated circuit may be a system on a chip (SOC). The top level module may be the module for the SOC, with the inputs and outputs of the SOC being the inputs and outputs of the top level module. Other modules may correspond to components of the system, and these component modules may be instantiated in the top level module. Still further submodules with the component modules may corresponding to major subcomponents of the components, etc. Any number of levels of hierarchy may be used. Additionally, a module may instantiate other modules and blocks at the same level, as desired.

The scan insertion described herein may be performed at any level of hierarchy in the modules that describe the integrated circuit. At a given level in the hierarchy, the scan chains for the next lower level in the hierarchy may be defined and the scan chain inputs and outputs may be identified for each block/module instantiation at the given level. Scan insertion may be performed to link the scan input pins and output pins at the given level to the scan chain inputs and outputs. The scan input pins and output pins at the given level may be referred to as global scan input pins and global scan output pins, since these pins may either be inputs and outputs of the integrated circuit or may be inputs and outputs to the next higher level in the hierarchy.

Blocks and/or modules may be described herein as having pins. In this context, a pin may be any connection point for a block or module. A pin may correspond to a pin on the integrated circuit that is actually fabricated and packaged. Additionally, a pin may correspond to a conductor physically located on or near a boundary of a block or module, which can be connected to with interconnect on the integrated circuit to connect the pin to other pins of modules and/or blocks. Accordingly, scan pins may be actual package pins (e.g. the scan input pins 16 and scan output pins 18), or may be connection points on blocks/modules (e.g. scan chain input pins such as pin 22 and scan chain output pins such as pin 24). Pins may also be referred to as signals, ports, or nets as well.

A scan chain is formed from two or more clocked storage devices (e.g. flops, registers, latches, etc.) beginning at a scan chain input pin on the block and ending at a scan chain output pin. Each device may include a scan data input and a scan data output. The scan data input of the initial device in the chain is connected to the scan chain input pin, and the scan data output of each device in the chain is connected to the scan data input of the next device in the chain (possibly with buffering for timing purposes). The scan data output of the final device in the scan chain is connected to the scan chain output pin. The scan chains 20A-20B illustrate the scan in and scan out connections of the devices. It is noted that the scan chain may be spread out over the area of the block that includes the scan chain, as scan chain 20B in FIG. 1 illustrates. The number of devices illustrated in the chains 20A-20B is not intended to illustrate the total number of devices in a chain. Any number of devices may be supported. For example, 256 devices may be supported in a chain, although larger and smaller numbers may be supported in other embodiments. During scanning, the scan chain may operate similar to a shift register, shifting scan data input bits down the chain and shifting bits out the scan chain output.

It is noted that, while the scan chain inputs and outputs illustrated in FIG. 1 are illustrated on the boundary of the corresponding blocks, the inputs and outputs may generally be near the boundary. For example, the blocks may include various standard cell circuits. The scan chain inputs and outputs may be within standard cells that are closest to the boundary of the blocks. It is further noted that, while rectangular blocks are shown in FIG. 1 for ease of illustration, a block need not be a rectangle. For example, blocks may have any rectilinear shape, in some embodiments. The number of blocks, scan chains per block, and scan input and output pins may all vary.

It is noted that, while the scan logic 14 is shown as a block in FIG. 1, the logic may be distributed within the module 10. For example, as previously mentioned, for embodiments that implement compressed scan, the multiplexors or other logic to combine scan chain inputs and outputs may be distributed.

Figure 2:
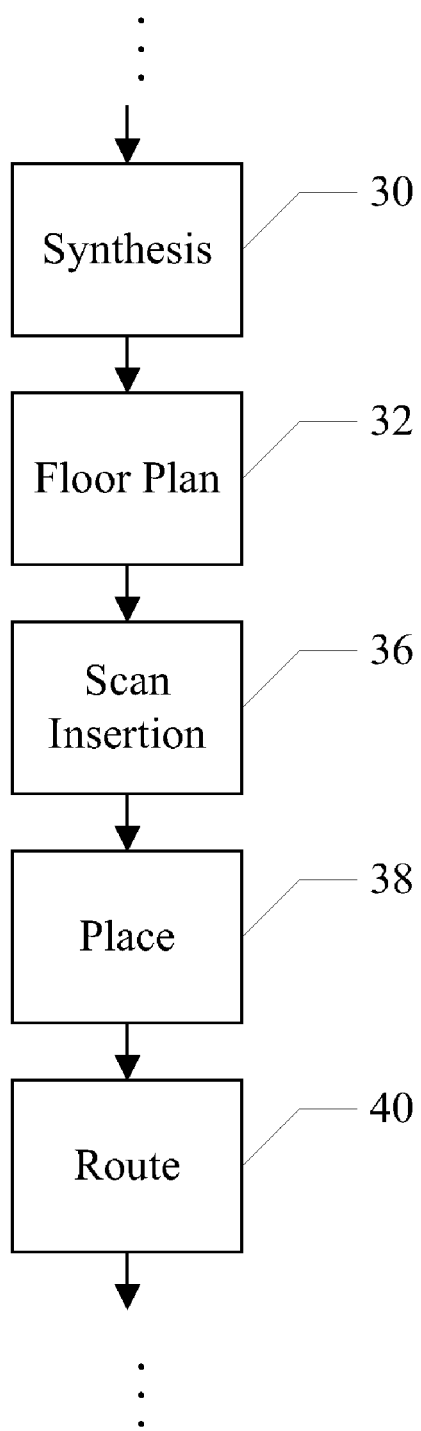
FIG. 2 is a flowchart illustrating one embodiment of a high level design methodology flow.

Turning next to FIG. 2, a flowchart is shown illustrating one embodiment of a portion of a design methodology flow. One or more design tools may be used to implement the design methodology. Each tool may include instructions which, when executed on a computer, implement the operation described. For example, a synthesis tool may perform synthesis, a design for test (DFT) tool may perform at least a portion of scan insertion, a floor planning tool may perform floor planning, etc. The tools may receive input in the form of files, manual user input, combinations thereof, etc. While the blocks are shown in a particular order for ease of understanding, other orders may be used. Furthermore, in some embodiments, work may proceed in parallel with feedback from later steps to earlier steps. For example, floor planning may indicate that a block is too big, which may cause design changes that are synthesized and added to the floor plan.

The methodology may include synthesizing RTL or other hardware description language (HDL) descriptions of the blocks, producing netlists (block 30). Each netlist may specify the cells that form the block, and interconnect between the cells may be specified via signal names associated within inputs and outputs of the cells. Signal names that are inputs and outputs of the blocks may also be associated with cells and may define which cells produce the inputs and outputs. Based on the numbers and sizes of cells, the area and configuration of the blocks may be estimated and may be floor planned (block 32). Inputs and outputs of the blocks may be located on the floor plan as well.

Scan insertion for the module 10 may be performed (block 36). The scan insertion may include using information from the floor plan to group the scan chain inputs and outputs of the blocks based on physically proximity. The scan insertion tool may output an RTL description of the scan logic for the module, which may be synthesized and added to the floor plan, may output a netlist that may be added to the floor plan.

The methodology may continue with placement of the cells within the blocks and the placement of the blocks according to the floor plan, and routing of the interconnect within and between blocks (blocks 38 and 40). The placement and routing result in modifying the floor plan and/or the design to meet various design parameters, and the design flow may be iterated to converge on a final design.

Figure 3:
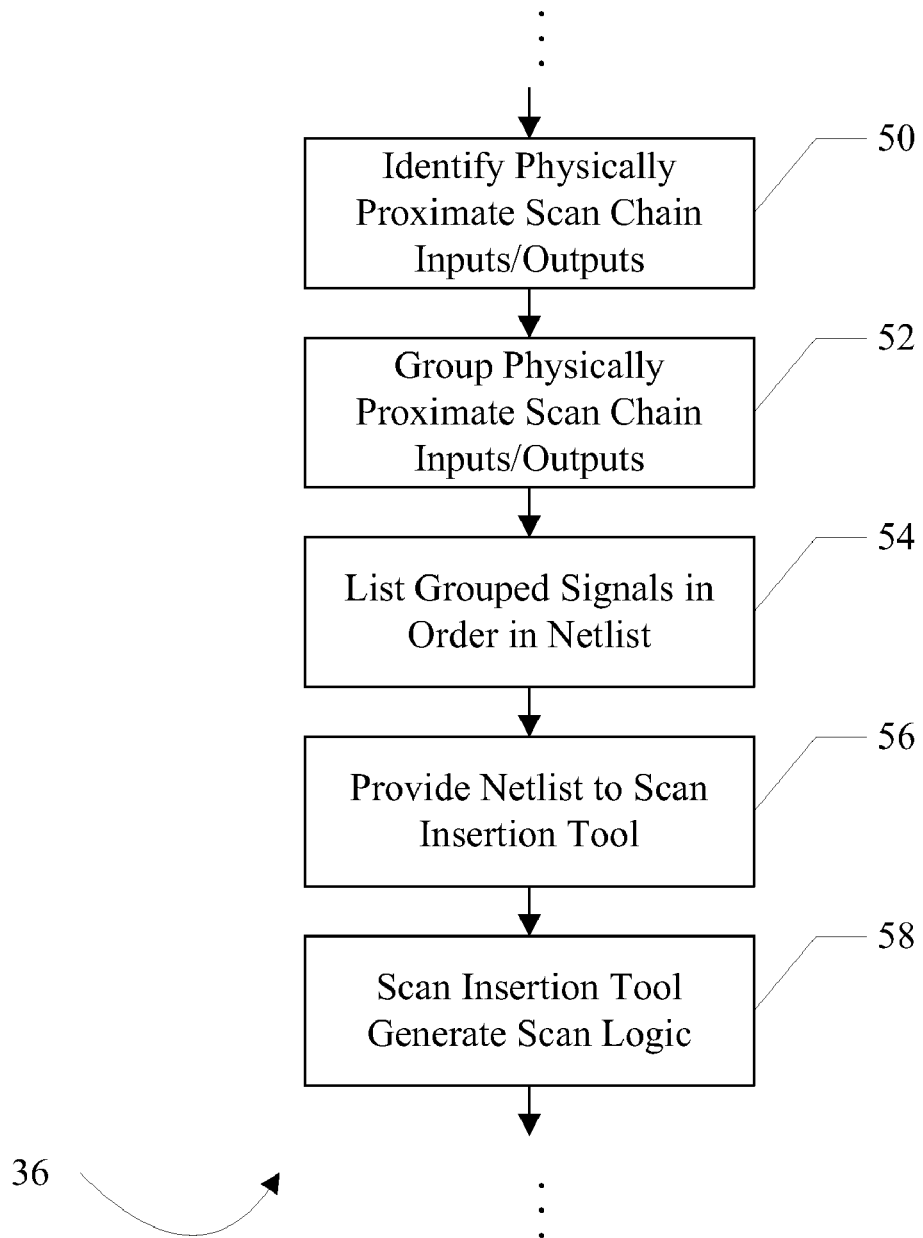
FIG. 3 is a flowchart illustrating one embodiment of scan insertion shown in FIG. 2.

Turning next to FIG. 3, a flowchart is shown illustrating one implementation of the scan insertion block 36 from the flowchart of FIG. 2. One or more design tools may be used to implement the scan insertion block 36. Each tool may include instructions which, when executed on a computer, may implement the operation described. That is, each tool may be configured to perform the operations described. While the blocks are shown in a particular order for ease of understanding, other orders may be used.

In the embodiment illustrated in FIG. 3, a scan grouping tool may receive the netlist of scan chain inputs and outputs for module 10, and may order the list according to groups of physically proximate pins. That is, nets corresponding to physically proximate scan chain pins may be listed in order within the netlist as a group, consecutively listing the nets in the group within the netlist. Other groups are listed consecutively as well, and any ungrouped pins are listed outside of the consecutive listings of groups. The scan grouping tool may provide the ordered list to a commercially-available scan insertion tool. The scan insertion tool may treat its input netlist as an ordered list, combining nets that are consecutively listed in the netlist. By ordering the netlist according to physical proximity, a more efficient scan insertion (in terms of area, for example) may be achieved. In other embodiments, the grouping of physically proximate pins may be integrated into the scan insertion tool.

The scan grouping tool may identify physically proximate scan chain inputs and outputs for the blocks in the module (block 50). As discussed previously, physical proximity may be based both on distance between pins (e.g. relative location in the floor plan) and on routability in the channels between the pins. Viewed in another way, the distance between pins may be measured along the routes that would be inserted to combine pins in the scan insertion.

The scan grouping tool may group the physically proximate scan chain pins into groups (block 52). Any number of groups may be defined, and any number of scan chain pins may be included in a group. In some embodiments, scan chain inputs and scan chain outputs are grouped into separate groups. That is, for scan compression/decompression, the scan chain inputs are grouped to receive decompressed data from the scan inputs 16, and the scan chain outputs are grouped to compress data for the scan outputs 18.

The scan grouping tool may list the grouped nets in order within the netlist to be provided to the scan insertion tool (block 54), and the scan grouping tool may provide the ordered netlist to the scan insertion tool (block 56). The scan insertion tool may use the netlist to generate scan logic for the scan block 14 (block 58).

Figure 4:
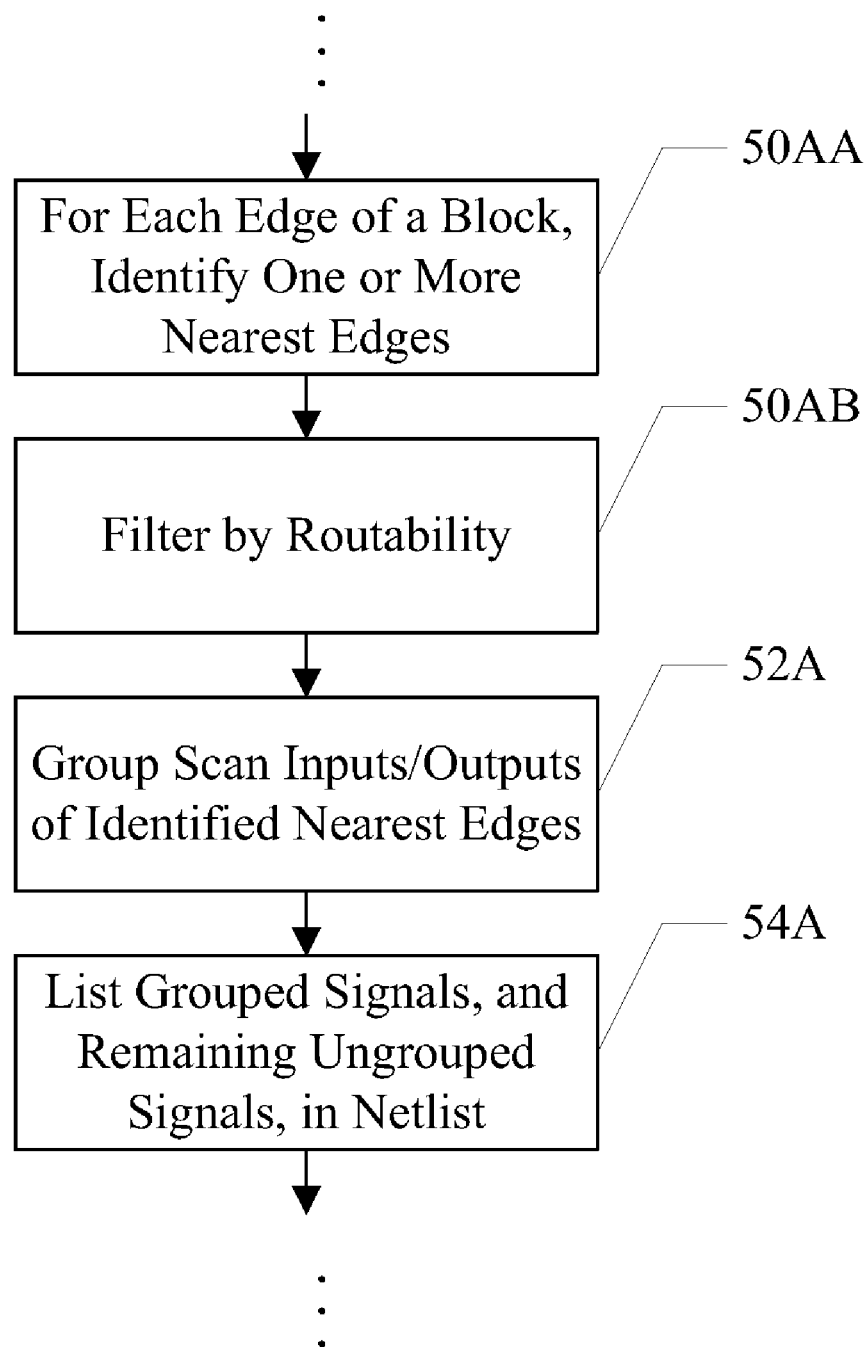
FIG. 4 is a flowchart illustrating one embodiment of a portion of the scan insertion shown in FIG. 3.

FIG. 4 is a flowchart illustrating a portion of the flowchart of FIG. 3 for one embodiment. Blocks listed with a reference numeral followed by a letter may be examples of the corresponding block from FIG. 3 that has the same reference numeral with no letters. Blocks listed with a reference numeral followed by two letters may be a portion of the like-numbered block with no letters from FIG. 3. Each tool may be configured to perform the operations described in the flowchart. That is, each tool may comprise instructions which, when executed, implement the operations described in FIG. 4.

The embodiment of the scan grouping tool represented by FIG. 4 may use nearest edge analysis for the blocks 12A-12F to locate physically proximate pins. That is, for each edge of the block, one or more nearest edges of other blocks may be located (block 50AA). The nearest edge or edges to a given edge may be edges that are nearer to the given edge than other edges of the blocks in the modules. In one embodiment, nearest edges may be edges that are parallel to the given edge. In such an embodiment, for example, the pin at the top of group 26C may not be included in the group, since it's edge is not parallel to the other edges in the group (i.e. the left edge of block 12E and the right edge of block 12F). Other embodiments may permit both parallel and perpendicular edges to be nearest edges to the given edge.

The scan grouping tool may filter the identified nearest edges based on routability between the blocks (block 50AB). That is, if a particular edge was identified as a nearest edge in block 50AA, but congestion between the given edge and the particular edge leads to a conclusion of unroutable, the particular edge may be eliminated as a nearest edge.

The scan grouping tool may group the scan chain inputs and outputs that are on or near the identified nearest edges and the given edge (block 52A). For example, the tool may begin at one end of the given edge and progress down the given edge toward the other end, capturing scan chain inputs and outputs in the order of their physical location along the given edge and capturing scan chain inputs and outputs on or near the nearest edges as well. The scan chain inputs and outputs from the nearest edges may be captured at the point along the given edge that would be intersected by a perpendicular from the point on the nearest edge. That is, the scan chain inputs and outputs may be captured as if the scan chain inputs and outputs on the nearest edges were placed on the given edge at the point where the perpendicular intersects the current edge, and the scan chain inputs were captured by beginning at one end and proceeding toward the other end. In FIG. 1, for example, in the group 26A, the scan chain outputs may be captured beginning with the pin at reference numeral 24, then the pin on the block 12C, then the other pin on the block 12A. The scan grouping tool may list the grouped signals in order within the netlist to be provided to the scan insertion tool (block 54A), and may list the ungrouped signals as well. The ungrouped signals may, e.g., be listed at the beginning or end of the netlist, or may be interleaved between groups (e.g. next to a nearest neighbor scan chain input or output, based on physical distance or physical proximity including routing).

Figure 5:
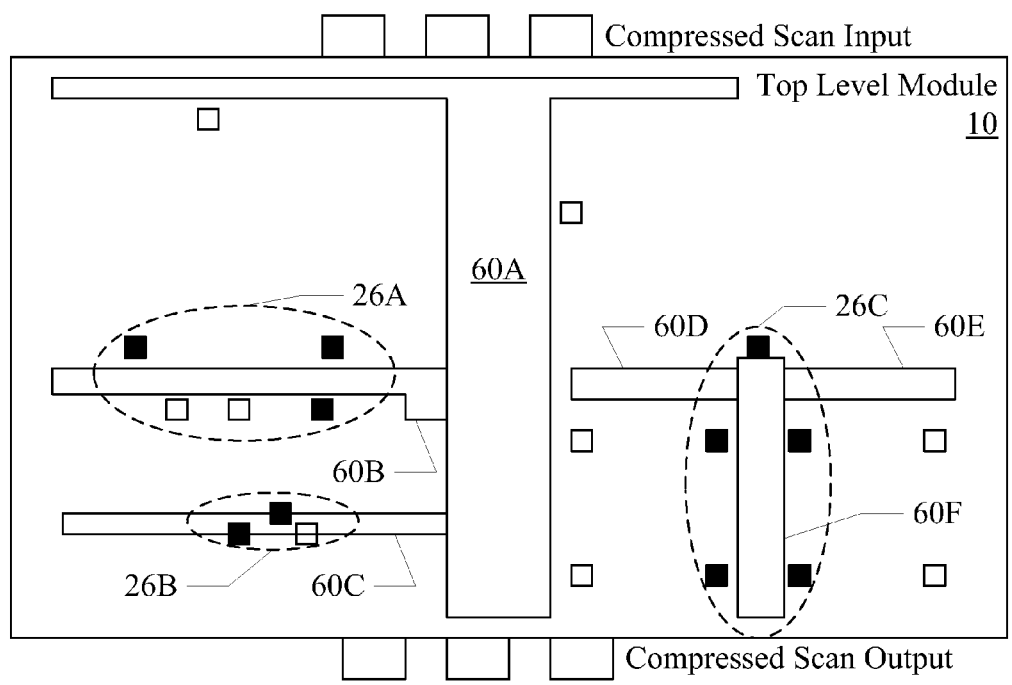
FIG. 5 is a block diagram illustrating one embodiment a top level module, scan inputs and outputs, and routable areas.

The divisions of modules into blocks in a hierarchy may not be implemented in all embodiments. Furthermore, in embodiments that do implement blocks and modules, the edges of the blocks/modules need not be considered for scan insertion. For example, FIG. 5 is a block diagram of the top level module 10 shown in FIG. 1, illustrating the same scan chain input and output pins shown in FIG. 1. The routability is also illustrated in FIG. 5 as various rectilinear objects in FIG. 5 (e.g. reference numerals 60A-60F). The scan chain inputs and outputs may be grouped by treating the inputs and outputs as points and finding nearest neighbor points, using the routability as a constraint. That is, the points may be determined to be nearest neighbors using paths through the routable regions 60A-60F. Any nearest-neighbor algorithm may be used. In the embodiment illustrated, the same groups 26A-26C that are illustrated in FIG. 1 may be found. For group 26C, the scan chain output pin on the block 12B may be included in the group 26C, which may not occur for nearest edge algorithms that only consider parallel edges.

Figure 6:
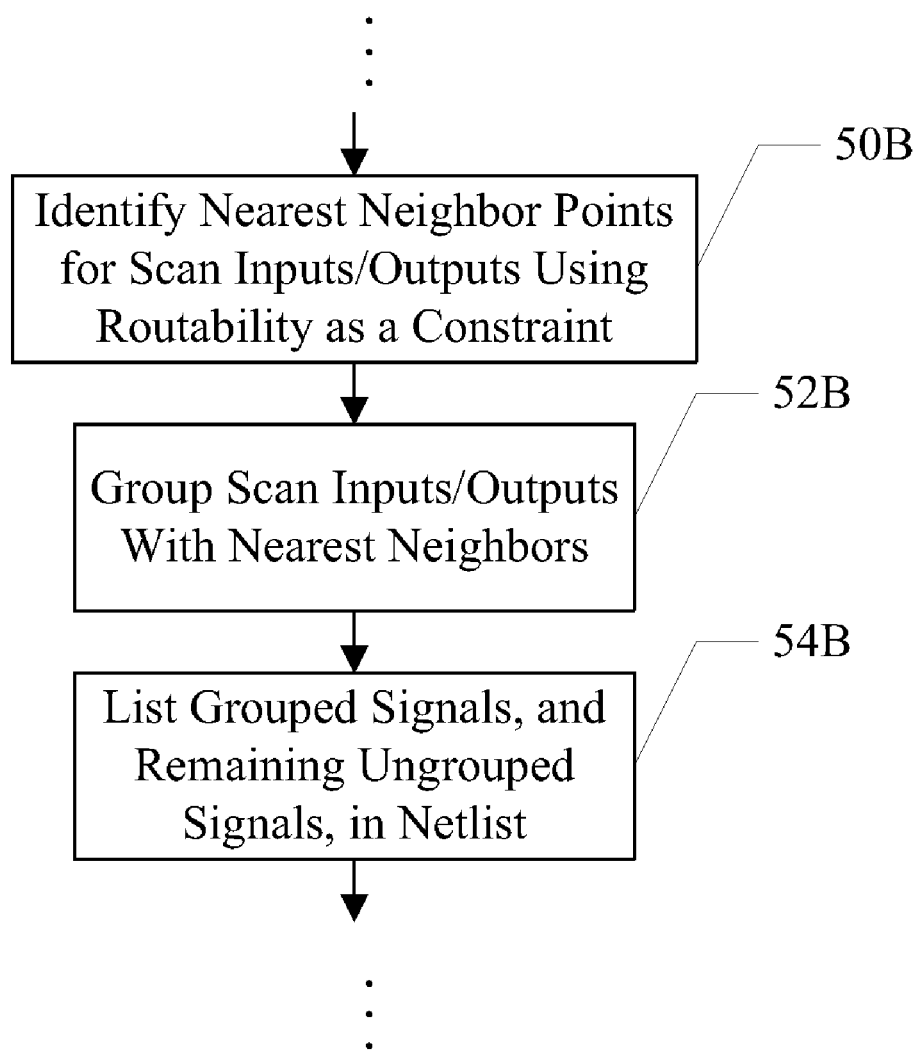
FIG. 6 is a flowchart illustrating another embodiment of a portion of the scan insertion shown in FIG. 3.

FIG. 6 is a flowchart illustrating a portion of the flowchart of FIG. 3 for one embodiment. Blocks listed with a reference numeral followed by a letter may be examples of the corresponding block from FIG. 3 that has the same reference numeral with no letters. Each tool may be configured to perform the operations described in the flowchart. That is, each tool may comprise instructions which, when executed, implement the operations described in FIG. 6.

The embodiment of the scan grouping tool represented by FIG. 6 may select a first scan chain input or output pin, and then may use nearest neighbor analysis with the remaining pins to identify one or more nearest neighbor pins using the routability regions as a constraint. The nearest neighbor analysis may be continued until the area over which the identified neighbors are located exceeds a desired area, or when neighbors within the group exceed a maximum distance between them, or when the number of points in the group exceeds a desired number, etc. in various embodiments (block 50B).

The scan grouping tool may group the scan chain inputs and outputs with their nearest neighbors (block 52B). The scan grouping tool may list the grouped signals in order within the netlist to be provided to the scan insertion tool (block 54B), and may list the ungrouped signals as well. The ungrouped signals may, e.g., be listed at the beginning or end of the netlist, or may be interleaved between groups (e.g. next to a nearest neighbor scan chain input or output, based on physical distance or physical proximity including routing).

Figure 7:
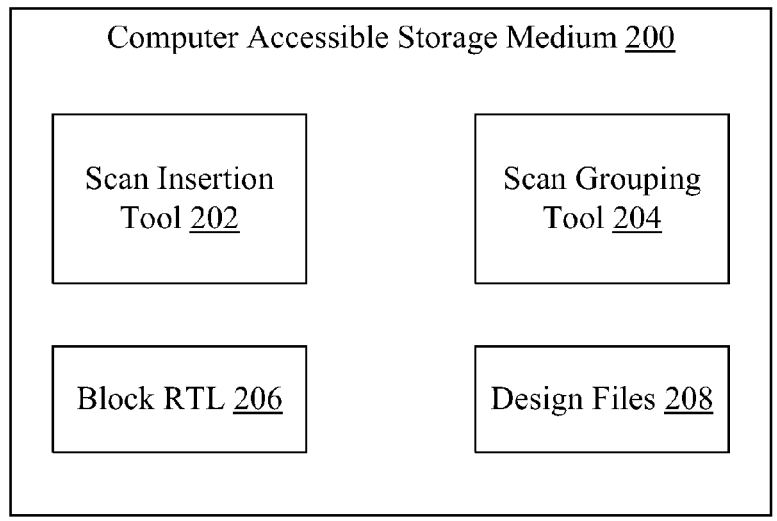
FIG. 7 is a block diagram of one embodiment of a computer accessible storage medium.

Turning now to FIG. 7, a block diagram of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, a flash memory interface (FMI), a serial peripheral interface (SPI), etc. Storage media may include microelectromechanical systems (MEMS), as well as storage media accessible via a communication medium such as a network and/or a wireless link. The computer accessible storage medium 200 in FIG. 7 may store the scan insertion tool 202, the scan grouping tool 204, the RTL files describing the blocks and/or modules of the integrated circuit 206, and various other design files 208 such as files related to synthesis, floor plan, place, and route. The scan insertion tool 202 may comprise any commercially available scan insertion tool. The scan grouping tool 204 may include instructions which, when executed, implement the operation described above for the tool with regard to any combination of FIGS. 3, 4, and/or 6. Generally, the computer accessible storage medium 200 may store any set of instructions which, when executed, implement a portion or all of the operation shown in FIGS. 2, 3, 4, and/or 6. In other embodiments, the operation of the scan grouping tool 204 may be integrated into the scan insertion tool 202. A carrier medium may include computer accessible storage media as well as transmission media such as wired or wireless transmission.

Figure 8:
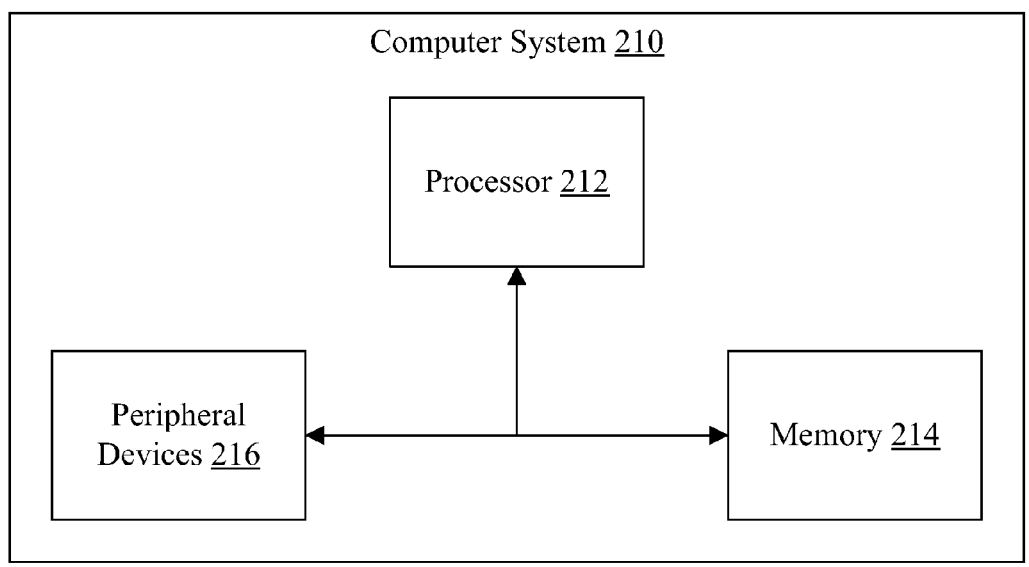
FIG. 8 is a block diagram of one embodiment of a computer system.

FIG. 8 is a block diagram of one embodiment of an exemplary computer system 210. In the embodiment of FIG. 8, the computer system 210 includes a processor 212, a memory 214, and various peripheral devices 216. The processor 212 is coupled to the memory 214 and the peripheral devices 216.

The processor 212 is configured to execute instructions, including the instructions in the software described herein such as the scan insertion tool 202, the scan grouping tool 204, and/or other tools. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to coupled the processor 212, the memory 214, and the peripheral devices 216.

The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use, data to be operated upon by the processor 212 during use, etc.

Peripheral devices 216 may represent any sort of hardware devices that may be included in the computer system 210 or coupled thereto (e.g. storage devices, optionally including a computer accessible medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method comprising:
identifying a physical proximity among a plurality of scan chain pins corresponding to scan chains included in an integrated circuit design, wherein the physical proximity among the plurality of scan chain pins is measured in terms of both relative pin locations and routability between pins; and
performing scan insertion to link the plurality of scan chain pins to global scan pins, wherein the scan insertion is performed using the physical proximity to select physically proximate pins of the plurality of scan pins for combination in the scan insertion.

2. The method as recited in claim 1 wherein the integrated circuit design comprises a plurality of blocks, wherein each of the plurality of scan chain pins is associated with one of the plurality of blocks, and wherein physical proximate pins of the plurality of scan chain pins are, in at least some cases, pins of different modules of the plurality of modules.

3. The method as recited in claim 1 wherein the global scan pins are coupled to the plurality of scan chain pins via compression/decompression logic, and wherein performing the scan insertion comprises generating the compression/decompression logic, including selecting the physically proximate pins for compression together.

4. The method as recited in claim 1 further comprising grouping the physically proximate pins in a netlist upon which the scan insertion is performed.

5. The method as recited in claim 4 wherein the netlist comprises a list of the plurality of scan chain pins, and wherein the grouping comprises listing the physically proximate pins in order in the netlist, and wherein performing the scan insertion comprises processing the netlist as an ordered list.

6. A computer accessible storage medium storing a plurality of instructions which, when executed:
process a plurality of scan chain pins within a module, the plurality of scan chain pins comprising inputs and outputs of scan chains within the module, wherein the processing includes determining which of the plurality of scan chain pins are physically near other ones of the plurality of scan chain pins, wherein the plurality of scan chain pins are determined to be physically near other ones of the plurality of scan chain pins responsive to relative pin locations and routability between pins;
specify one or more groups of the plurality of scan chain pins, each group comprising scan chain pins that are physically near as determined in the processing of the plurality of scan chain pins; and
perform scan insertion for the module, the scan insertion using the groups to reduce an amount of area occupied within the module by components related to the scan insertion.

7. The computer accessible storage medium as recited in claim 6 wherein the instructions which, when executed, process the plurality of scan chain pins comprise instructions which, when executed:
identify an edge of a block included in the module, the edge identifying a boundary of the block;
identify one or more nearest edges to the edge of the block; and
identify scan chain pins on and near the edge and scan chain pins on and near the one or more nearest edges as scan chain pins that are physically near each other.

8. The computer accessible storage medium as recited in claim 7 wherein the instructions which, when executed, specify the one or more groups comprise instructions which, when executed, specify the scan chain pins on and near the edge and the scan chain pins and near the one or more nearest edges as a group.

9. The computer accessible storage medium as recited in claim 6 wherein the instructions which, when executed, process the plurality of scan chain pins comprise instructions which, when executed:
select a first scan chain pin of the plurality of scan chain pins; and
identify one or more nearest neighbor scan chain pins as physically near, using the routability between scan chain pins as a constraint.

10. The computer accessible storage medium as recited in claim 9 wherein the instructions which, when executed, specify the one or more groups comprise instructions which, when executed, specify the first scan chain pin and the one or more nearest neighbor scan chain pins as a first group.

11. A computer accessible storage medium storing a plurality of instructions which, when executed:
determine which of a plurality of scan chain inputs and outputs within a module are physically proximate other ones of the plurality of scan chain inputs and outputs responsive to a routability between the plurality of scan chain inputs and outputs and to a distance between the plurality of scan chain inputs and outputs; and
group the plurality of scan chain inputs and outputs in one or more groups of physically proximate scan chain inputs and outputs according to the determination of which are physically proximate; and perform scan insertion for the module to link the plurality of scan chain inputs and outputs with scan inputs and outputs of the module responsive to the groups of physically proximate scan chain inputs and outputs.

12. The computer accessible storage medium as recited in claim 11 wherein the instructions which, when executed, group the plurality of scan chain inputs and outputs comprise instructions which, when executed, generate an ordered netlist in which the plurality of scan chain inputs and outputs are listed in order according to the groups.

13. The computer accessible storage medium as recited in claim 12 wherein the instructions which perform the scan insertion comprise instructions which, when executed, link the plurality of scan inputs and outputs according to the ordered netlist.

14. A computer accessible storage medium comprising a plurality of instructions which, when executed:
receive physical position data identifying locations of block scan inputs and outputs on each block of a plurality of blocks in a module and routability data identifying routability in the module;
determine a plurality of groups of the block scan inputs and outputs responsive to the position data and the routability data; and
perform scan insertion to link the block scan inputs and outputs to module scan inputs and outputs, wherein the scan insertion is responsive to the plurality of groups, wherein the block scan inputs and outputs within a given group of the plurality of groups are combined in the scan insertion.

15. The computer accessible storage medium as recited in claim 14 wherein the instructions which, when executed, determine the plurality of groups comprise instructions which, when executed, order a netlist to include the block scan inputs and outputs of each group of the plurality of groups listed together by group.

16. The computer accessible storage medium as recited in claim 14 wherein the instructions which, when executed, determine the plurality of groups comprise instructions which, when executed:
determine a nearest edge or edges to each edge of a block;
identify block scan inputs and outputs on the edge and the nearest edge or edges as a group.

17. The computer accessible storage medium as recited in claim 14 wherein the instructions which, when executed, determine the plurality of groups comprise instructions which, when executed:
select a first block scan input; and
identify one or more nearest neighbor block scan inputs to the first block scan input as a group.

18. The computer accessible storage medium as recited in claim 14 wherein each group of the plurality of groups includes only inputs or only outputs.

* * * * *